(12) United States Patent
Stelzl et al.

(10) Patent No.: US 6,528,924 B1
(45) Date of Patent: *Mar. 4, 2003

(54) ELECTRONIC COMPONENT, IN PARTICULAR A COMPONENT OPERATING WITH SURFACE ACOUSTIC WAVES

(75) Inventors: Alois Stelzl, München (DE); Hans Krüger, München (DE); Wolfgang Pahl, München (DE)

(73) Assignee: Siemens Aktiengesellschaft, München (DE)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,887

(22) Filed: Nov. 24, 1998

Related U.S. Application Data

(63) Continuation of application No. PCT/DE97/01055, filed on May 23, 1997.

(30) Foreign Application Priority Data

May 24, 1996 (DE) .......................... 196 21 127

(51) Int. Cl.⁷ .............................................. H01L 41/08
(52) U.S. Cl. .................... 310/313 R; 310/340; 310/344
(58) Field of Search .......................... 310/313 R, 340, 310/344, 346, 348

(56) References Cited

U.S. PATENT DOCUMENTS

| | | | |
|---|---|---|---|
| 3,438,873 A | | 4/1969 | Schmidt ...................... 204/35 |
| 4,028,646 A | * | 6/1977 | Ikushima et al. ........ 310/340 X |
| 4,978,879 A | * | 12/1990 | Satoh et al. ............. 310/313 R |
| 5,390,401 A | * | 2/1995 | Shikata et al. .......... 310/313 R |
| 5,459,368 A | | 10/1995 | Onishi et al. |
| 5,471,722 A | * | 12/1995 | Yatsuda ................... 310/344 X |
| 5,801,474 A | * | 9/1998 | Sakairi .................... 310/344 X |
| 5,821,665 A | * | 10/1998 | Onishi et al. ........... 310/344 X |
| 5,939,817 A | * | 8/1999 | Takado .................... 310/313 R |
| 6,262,513 B1 | * | 7/2001 | Furukawa et al. ....... 310/313 R |

FOREIGN PATENT DOCUMENTS

| | | | | |
|---|---|---|---|---|
| DE | 39 11 176 A1 | 10/1989 | | |
| DE | 195 37 337 A1 | 4/1996 | | |
| EP | 0 472 856 A2 | 3/1992 | | |
| EP | 0 534 251 A1 | 3/1993 | | |
| EP | 0 637 871 A1 | 2/1995 | | |
| GB | 2 058 506 A | 4/1981 | | |
| JP | 360090416 | * | 5/1985 | ................. 310/340 |
| JP | 0177609 | * | 7/1990 | ............. 310/313 R |
| JP | 0173213 | * | 7/1991 | ............. 310/313 R |
| JP | 0190312 | * | 8/1991 | ............. 310/313 R |
| JP | 4 170 811 | 5/1992 | | |
| JP | 404170811 | * | 6/1992 | ............. 310/313 R |
| JP | 5-90872 | 4/1993 | | |
| JP | 5-90883 | 4/1993 | | |
| JP | 7-18446 | 3/1995 | | |
| JP | 7-99420 | 4/1995 | | |
| JP | 7-111438 | 4/1995 | | |
| JP | 7 154 185 | 6/1995 | | |
| JP | 8-51333 | 2/1996 | | |

OTHER PUBLICATIONS

Anonymous: "Thin Film Module", IBM Technical Disclosure Bulletin, vol. 31, No. 8, Jan. 1989, pp. 135–138.

* cited by examiner

*Primary Examiner*—Mark O. Budd
(74) *Attorney, Agent, or Firm*—Lawrence A. Greenberg; Werner H. Stemer; Ralph E. Locher

(57) ABSTRACT

A SAW component has a component system that is mounted on a base plate such that it makes electrical contact with the base plate. A protective coating is provided on a component side of the component system that faces away from a connecting region between the component system and the base plate. The protective coating forms a seal, which is proof against environmental influences, for the component system toward the base plate.

9 Claims, 3 Drawing Sheets

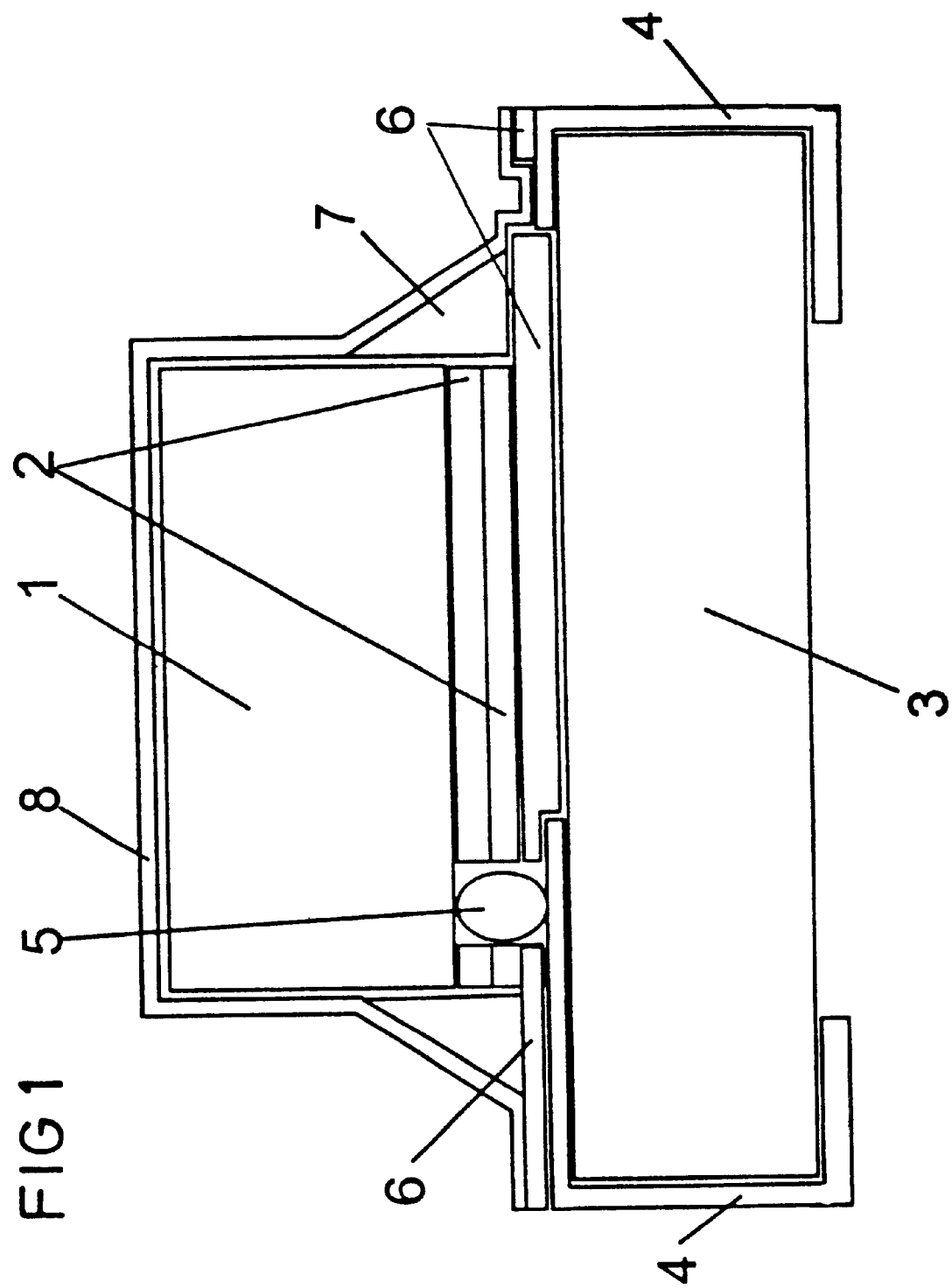

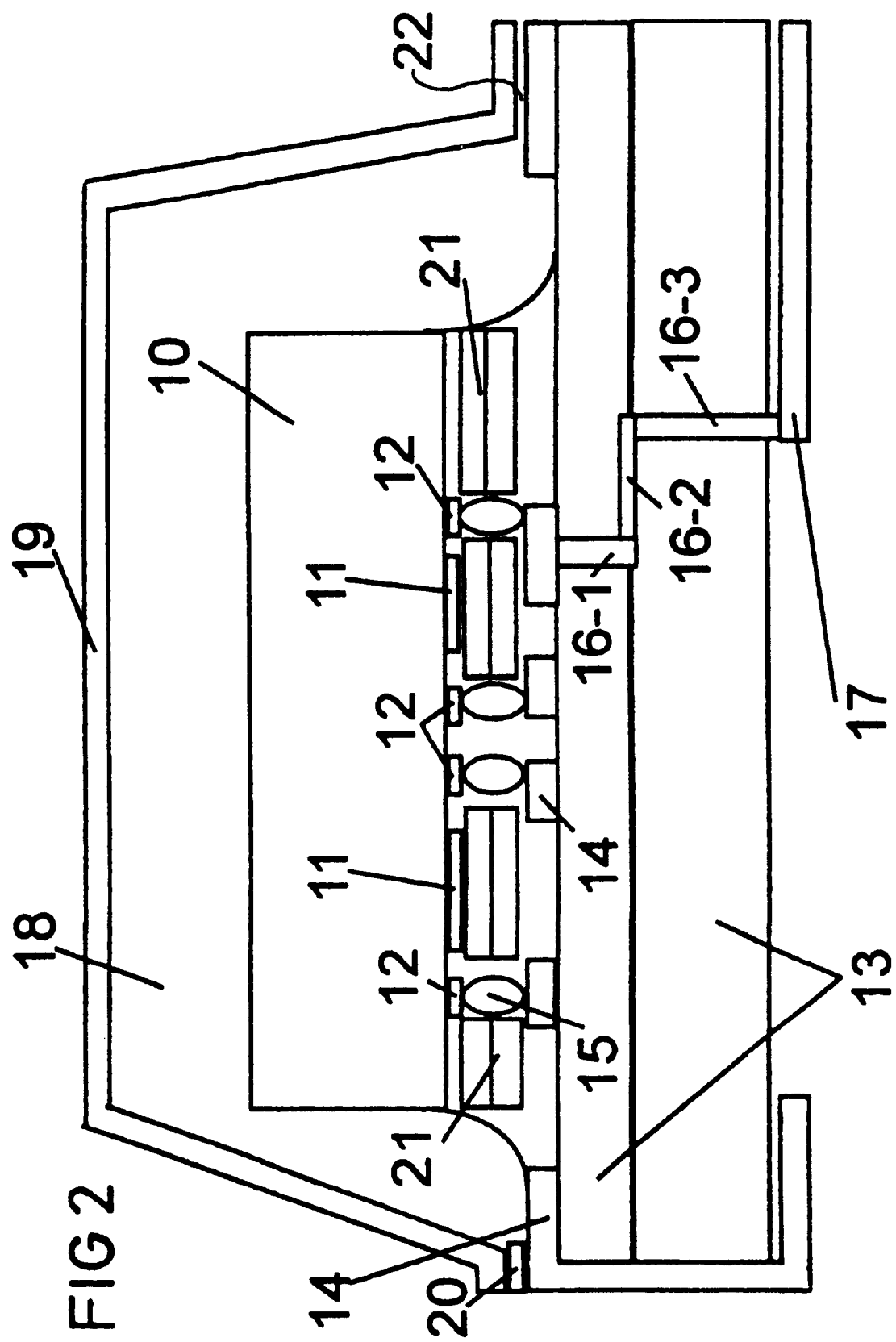

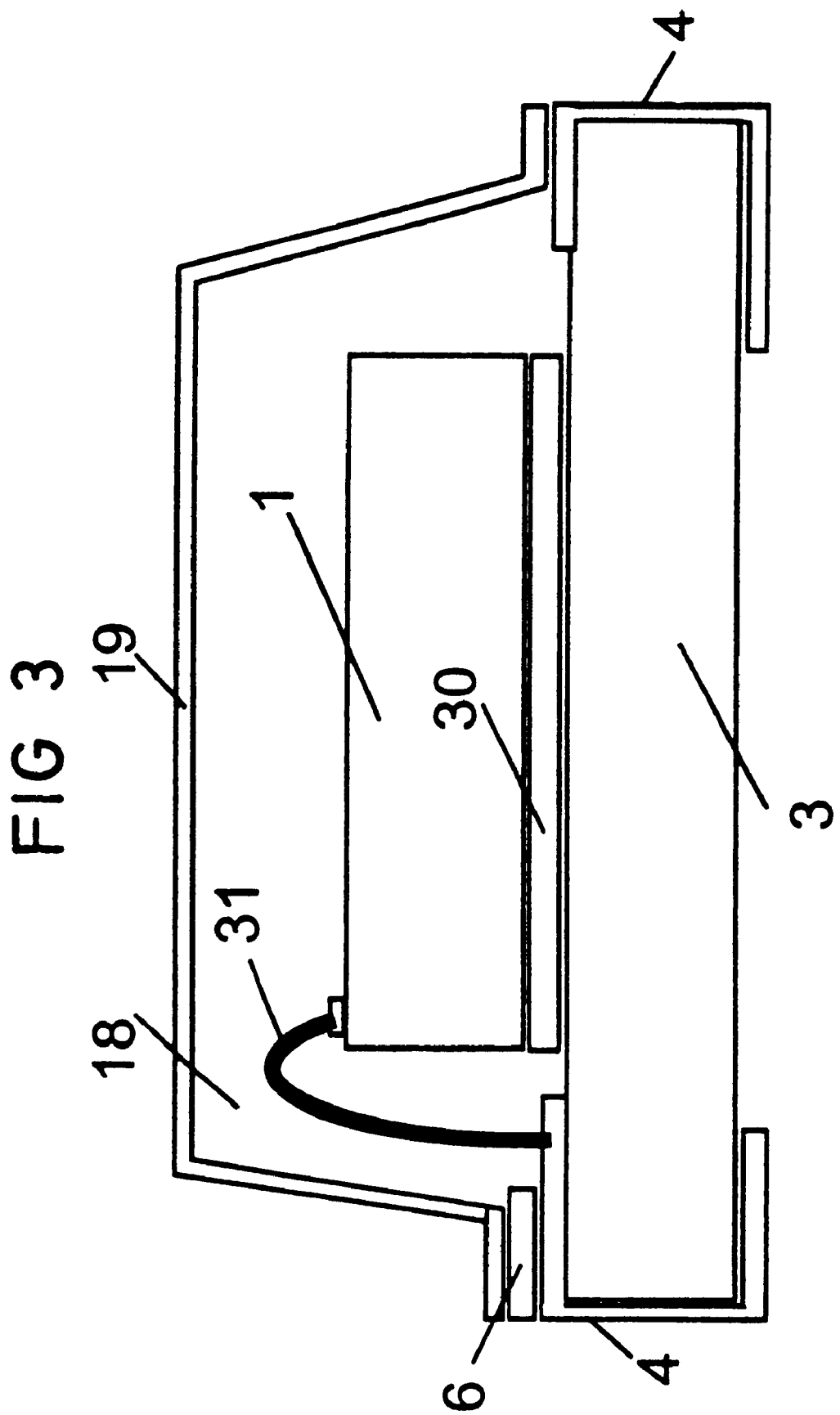

ELECTRONIC COMPONENT, IN PARTICULAR A COMPONENT OPERATING WITH SURFACE ACOUSTIC WAVES

CROSS-REFERENCE TO RELATED APPLICATION

This is a continuation of copending International Application PCT/DE97/01055, filed May 23, 1997, which designated the United States.

BACKGROUND OF THE INVENTION

Field of the Invention

The present invention relates to an electronic component, in particular a component operating with surface acoustic waves. More specifically, the invention relates to a component system formed of electrically conductive structures disposed on a substrate. The structures are mounted so as to make electrical contact with a base plate and are covered by a protective coating for protecting the structures from environmental influences.

It is known for electronic components to be protected by protective coatings against environmental influences, for example, to be protected against attacks by chemical substances such as moisture. For example, U.S. Pat. No. 3,438,873 describes the protection of semiconductor components by protective coatings of silicon nitride, aluminum oxide and mixed silicates such as aluminum silicate. In this case, the protective coating is applied directly onto the system of the semiconductor component. The term component system in this case describes the substrate which contains the active electronic parts of the component. In other words, the component system is thus the component excluding any housing containing it.

In certain electronic components, it may not be sensible, and may even be damaging to the component function, to apply a protective coating of the above type onto the component system itself. This is the case, for example, with components operating with surface acoustic waves, since a protective coating applied onto the component system of such components can adversely affect the propagation of surface acoustic waves. Another example of this would be sensors for mechanical stresses, since mechanical forces caused by the protective coating in the sensor system may influence the detection of mechanical stresses to be measured.

SUMMARY OF THE INVENTION

It is accordingly an object of the invention to provide an electronic component, in particular a component operating with surface acoustic waves which overcomes the above-mentioned disadvantages of the prior art devices of this general type, which protects electronic components against environmental influences without the adverse effects which can occur from protective coatings applied onto the component systems.

With the foregoing and other objects in view there is provided, in accordance with the invention, an electronic component, including: a base plate; a component system having a substrate and electrically conductive structures disposed on the substrate, the component system electrically contacting the base plate in a connecting region; and a protective coating shielding the component system, the protective coating forming an environmental proof seal protecting the component system against environmental influences toward the base plate, the protective coating is one of a metal coating and a partial coating of metal.

In accordance with an added feature of the invention, the component system is mounted on the base plate using flip-chip technology.

In accordance with another feature of the invention, the component system is mounted on the base plate and electrically contacts the base plate with wire contacts.

In accordance with an additional feature of the invention, the substrate has a side facing away from the connecting region, the protective coating is applied toward the base plate to the side of the substrate facing away from the connecting region between the component system and the base plate forming the environmental proof seal toward the base plate.

In accordance with a further added feature of the invention, there is a plastic covering disposed between the component system and the protective coating, and the protective coating is applied to the plastic covering toward the base plate for forming the environmental proof seal toward the base plate.

In accordance with a further additional feature of the invention, the protective coating is a coating formed from a plurality of partial coatings.

In accordance with another added feature of the invention, at least one of the plurality of partial coatings is a glass coating.

In accordance with another additional feature of the invention, the glass coating is a lower partial coating of a partial coating sequence.

In accordance with yet another feature of the invention, there is a corrosion protective coating disposed on the protective coating.

In accordance with an added feature of the invention, there is an adhesive coating disposed under the protective coating.

In accordance with an additional feature of the invention, the metal coating forming the protective coating is also an electrical contact.

In accordance with another feature of the invention, the metal coating and the partial coating of metal forming the protective coating is applied by one of vapor deposition, vacuum metallization, electrochemical treatment, and lamination.

In accordance with a concomitant feature of the invention, the component system is a surface acoustic wave component system.

Other features which are considered as characteristic for the invention are set forth in the appended claims.

Although the invention is illustrated and described herein as embodied in an electronic component, in particular a component operating with surface acoustic waves, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic view of a first embodiment of electronic components according to the invention;

FIG. 2 is a diagrammatic view of a second embodiment of the electronic components; and FIG. 3 is a diagrammatic view of a third embodiment of the electronic components.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a component system mounted on a base plate 3 such that it makes electrical contact. The component system is illustrated schematically by a substrate 1 and an insulating frame 2 which surrounds non-illustrated electrically conductive structures. The electrically conductive structures may be, for example, interdigital converters, resonators or reflectors for SAW components.

The term "base plate" for the purposes of the present invention defines any substrate with conductor tracks or interconnects mounted on it, on a plastic, glass or ceramic base. Conductor tracks 4 are provided on the base plate 3 and make contact via bumps 5 with the non-illustrated conductive structures on the substrate 1 of the component system. Such electrical contacts include the so-called flip-chip mounting which is known per se.

An insulating coating 6, which is composed, for example, of epoxy resin or glass, is provided on the base plate 3, between the conductor tracks 4 and the insulating frame 2 which surrounds the electrically conductive structures on the substrate 1. Finally, in the connecting region between the component system 1, 2 and the base plate 3, a surrounding frame 7 is provided which may be, for example, an adhesive, a potting resin or a pressing compound. The surrounding frame 7 is provided in particular to absorb shear forces which occur as a result of different thermal expansion levels in the component system 1, 2 and the base plate 3, and could mechanically adversely affect the electrical contact between the electrically conductive structures on the substrate 1 and the conductor tracks 4 on the base plate 3 via the bumps 5.

According to the invention, a protective coating 8 is provided on the component side which faces away from the connecting region between the component system 1, 2 and the base plate 3, and forms a seal, which provides protection against environmental influences, for the component system 1, 2 toward the base plate 3. As will be explained in more detail in the following text, the protective coating 8 may be formed in various ways.

In the case of the embodiment of a SAW component as shown in FIG. 2, a SAW component system is formed of a piezoelectric substrate 10 as well as conductive structures 11 (which are provided on the substrate 10) and connecting surfaces 12 (pads) for the conductive structures 11. The electrically conductive structures 11 may once again be, for example, interdigital converters, resonators or reflectors. The conductive structures 11 and the pads 12 are surrounded by an insulating frame 21, according to the embodiment shown in FIG. 2. The illustration of the SAW component system 10, 11, 12 in FIG. 2 is, once again, only of a schematic nature. The complete construction of such the component system for SAW components is known per se and will thus not be explained in any more detail here.

In addition, a base plate 13 is provided, on whose side facing the component system 10, 11, 12 conductor tracks 14 are provided, with bumps 15 located on them, via which electrical contact is made between the component and the pads 12. The construction of the base plate 13 is not limited to two layers. Base plates with more than two layers may also be used.

The electrical contacts can be brought out of the component by passing the conductor tracks 14 around the base plate 13, as is illustrated on the left-hand side of FIG. 2, or by the base plate 13 being connected via bushings 16-1, 16-2, 16-3 to conductor tracks 17 on the outside of the base plate 13. The configuration of the electrical bushing 16-1, 16-2, 16-3 offset in the vertical direction is used to prevent ingress of chemical substances which adversely affect component operation, that is to say the offset of the bushing ensures a gas seal from the outside of the base plate 13. If the conductor tracks 14 are passed around the base plate 13 and are connected to a pad 12 via bumps 15, an insulating coating 20 is required between the conductor track 14 and a protective coating 19, which is described in the following text.

The component system 10, 11, 12 is covered by a plastic sheet 18 on the base plate 13. The plastic sheet covering 18 may be formed by potting resins, pressing compounds or thermoplastics.

According to the invention, a protective coating 19 is provided on the plastic sheet covering 18, on the side facing away from the connecting region between the component system 10, 11, 12 and the base plate 13, and forms a seal, which is proof against environmental influences toward the base plate 13.

As has already been stated above, the protective coating 8 as shown in FIG. 1, and protective coating 19 as shown in FIG. 2, can be formed in various ways. According to one embodiment, it may be a coating containing a metal or a completely metal coating. Furthermore, (although this is not illustrated specifically in FIGS. 1 and 2) it can also be formed by a plurality of partial coatings, at least one of which is a metal coating. Furthermore, one of the partial coatings may be a glass coating which may be, in particular, the lower partial coating of a partial coating sequence. The metals which may be used include copper, nickel or gold. A metal coating may be applied, for example, by vapor deposition, vacuum metallization, electrochemical treatment or lamination. If required, a corrosion protective coating 40 may in this case be provided on the metal coating. Furthermore, an adhesive coating 41 may be provided under the metal coating.

As is illustrated on the basis of the embodiment shown in FIG. 2, the protective coating 19, that is to say specifically its metallic part, can be made contact with electrically, so that the protective coating 19 is not only a coating which provides protection against environmental influences, but at the same time also forms a radio-frequency shield for the component system 10, 11, 12. To this end, the protective coating 19 is connected to the conductor track 14 on the base plate 13, as is illustrated by a link 22 in FIG. 2.

FIG. 3, in which identical parts to those in FIGS. 1 and 2 are provided with the same reference symbols, shows an embodiment in which the component system has wire contacts. In this case, the substrate 1 is mounted on the base plate 3 by a suitable joint, for example an adhesive 30. Wire contact is made via contact wires 31 to the conductor tracks 4 on the side facing away from the mounting region.

In this embodiment as well, a plastic sheath 18 with a protective coating 19 according to the invention is provided, corresponding to that shown in FIG. 2.

We claim:

1. An electronic component, comprising:

a base plate;

a component system having a substrate and electrically conductive structures disposed on said substrate, said component system electrically contacting said base plate in a connecting region, and being mounted on said base plate using flip-chip technology; and a protective coating that is a single completely metal layer shielding said component system, said protective coating forming an environmental proof seal protecting said component system against environmental influences toward said base plate;

said protective coating being a coating selected from the group consisting of a vapor deposited coating, a vacuum metallization coating, an electrochemically treated coating, and a laminated coating; and said substrate having a side facing away from said connecting region, said single completely metal layer applied to said base plate and to said side of said substrate facing away from said connecting region forming said environmental proof seal toward said base plate.

2. The component according to claim 1, including a corrosion protective coating disposed on said protective coating.

3. The component according to claim 1, wherein said metal coating forming said protective coating is also an electrical contact.

4. The component according to claim 1, wherein said component system is a surface acoustic wave component system.

5. An electronic component, comprising:

a base plate;

a component system having a substrate and electrically conductive structures disposed on said substrate, said component system electrically contacting said base plate in a connecting region, and being mounted on said base plate using flip-chip technology; and a cover defined by a plurality of coatings, said plurality of said coatings including a metal coating shielding said component system, said metal coating forming an environmental proof seal protecting said component system against environmental influences toward said base plate;

said substrate having a side facing away from said connecting region, said metal coating attached to said base plate and to said side of said substrate facing away from said connecting region forming said environmental proof seal toward said base plate.

6. The component according to claim 5, including a plastic covering disposed between said component system and said plurality of said coatings, and said plurality of said coatings is applied to said plastic covering toward said base plate for forming said environmental proof seal toward said base plate.

7. The component according to claim 5, wherein at least one of said plurality of said coatings is a glass coating.

8. The component according to claim 7, wherein said glass coating is a lower coating of said plurality of said coatings.

9. The component according to claim 5, including an adhesive coating disposed under said metal coating.

* * * * *